United States Patent [19]

Jacobs et al.

[11] Patent Number: 4,509,009
[45] Date of Patent: Apr. 2, 1985

[54] SINGLE DEVICE FOR MEASUREMENT OF INFRARED OR MILLIMETER WAVE RADIATION

[75] Inventors: Harold Jacobs, West Long Branch; Samuel Dixon, Jr., Neptune; Edmund E. Malecki, Rumson, all of N.J.

[73] Assignee: The United States of America as represented by the Secretary of the Army, Washington, D.C.

[21] Appl. No.: 496,165

[22] Filed: May 19, 1983

[51] Int. Cl.³ .............................................. G01R 23/04
[52] U.S. Cl. ..................................... 324/95; 250/338; 250/370
[58] Field of Search .................. 324/95; 250/338, 370

[56] References Cited

U.S. PATENT DOCUMENTS

| 3,492,489 | 1/1970 | Chynoweth | 250/338 |
| 3,568,058 | 3/1971 | Komatsubara | 324/95 |
| 4,236,165 | 11/1980 | Kawashima et al. | 357/30 |
| 4,348,686 | 9/1982 | Esaki et al. | 324/95 |
| 4,454,489 | 6/1984 | Donazzan et al. | 333/229 |

Primary Examiner—Stewart J. Levy
Attorney, Agent, or Firm—Anthony T. Lane; Michael Zelenka; Jeremiah G. Murray

[57] ABSTRACT

A radiation measurement means is shown which has the capability of detecting radiation in both the millimeter wave, and the infrared, frequency regions. A basic self-oscillating Gunn diode is enclosed in a donut shaped silicon ring. The presence of infrared energy will create holes and electrons in the silicon material, altering its conductivity, and lower the power of oscillation. The realized drop in oscillating power identifies the infrared. Millimeter wave radiation is detected because an intermediate frequency is generated as the Gunn diode operates as a self-oscillating mixer of the new different frequency with its own oscillating frequency. Thus it is possible to detect signals from both ranges, in a single device.

9 Claims, 1 Drawing Figure

SINGLE DEVICE FOR MEASUREMENT OF INFRARED OR MILLIMETER WAVE RADIATION

The invention described herein may be manufactured, used, and licensed by or for the Government, for Governmental purposes without the payment to me of any royalties thereon.

BACKGROUND AND FIELD OF THE INVENTION

In the field of radiation measuring devices, it has been necessary to utilize different structure devices for measuring different frequency waves. For example, the millimeter, microwave, and infrared wave band frequency regions all require separate measuring devices for measuring radiation. The construction of a single device which could be used to measure waves in two to more regions would clearly be advantageous; it would permit a great simplification which could reduce costs and also permit miniaturization.

OBJECTS OF THE INVENTION

Accordingly, an object of this invention is to devise a wave measuring instrument which can detect both infrared and millimeter wave frequency radiation.

Other objects and advantages of the invention as will be understood to those skilled in the art will be apparent from the following description of the invention, in which:

LIST OF FIGURES

FIG. 1 shows a cross-sectional side view of a wave measuring device according to the invention.

DETAILED DESCRIPTION OF THE INVENTION

Figure 1:
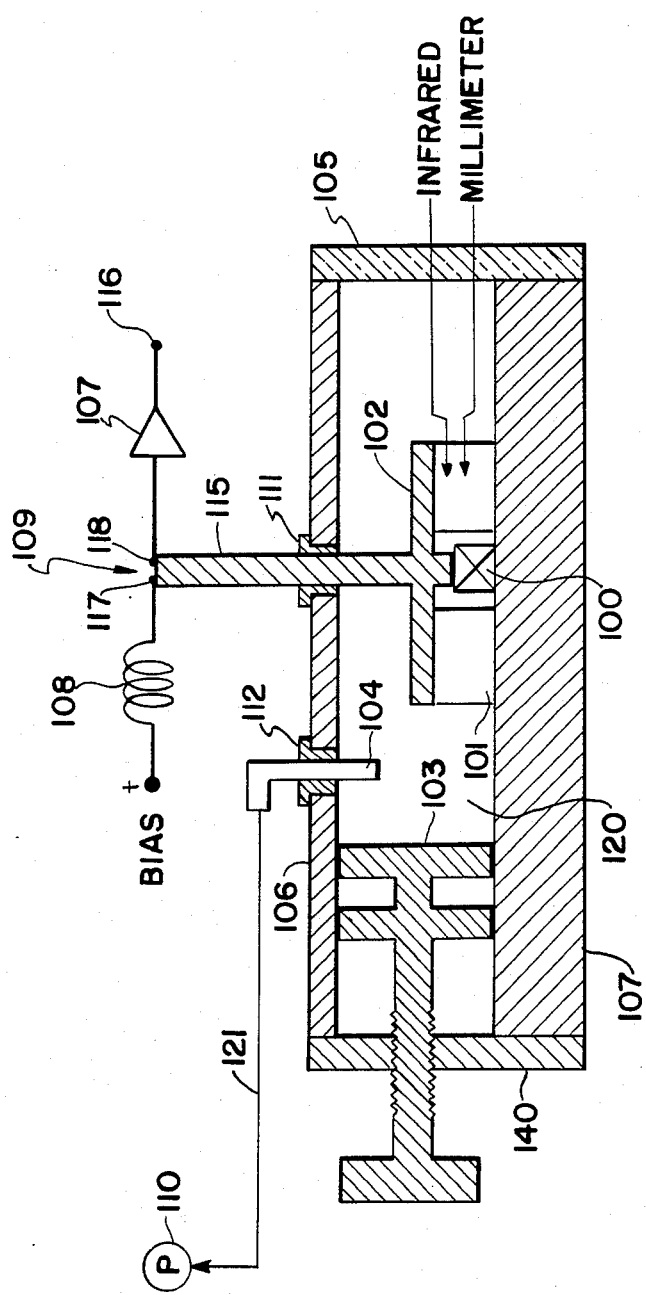

In FIG. 1, a wave measuring device according to this invention is shown in cross-sectional side view. The structure comprises a cavity 120 comprising metal on all sides; e.g., metal top 106, metal base 107, metal side 110, except for the side 105 which is an optical window. The window 105 through which waves may enter, is of a relatively high resistance type optical material such as glass. The window should be of a material that can block visible light but also is capable of passing infrared waves and of course also millimeter wave radiation. A semiconductor material such as Gallium Arsenide may also be used for 105; this material will also pass near-infrared waves in addition to the infrared wave radiation.

Within the cavity bound by the respective metal sides, top, bottom, and window, etc., there is placed a self-oscillating Gunn diode 100; or suitable self-oscillating negative resistance device generally speaking. As will be explained, when energy from certain radiation waves reaches Gunn diode 100, it causes the Gunn diode self-oscillation to include a mixing operating of the new wave frequency with the self-oscillation frequency. An intermediate frequency oscillation, in addition to the usual self-oscillating frequency and other frequency signals results from such mixing. The intermediate frequency would be indicative of receipt of such type of radiation among other indications and therefore could be used to indicate such radiation. The self-oscillation of Gunn diode 100 is ordinarily accomplished with aid of biasing electrode 102, to which a biasing voltage of some +5 to +10 volts typically is applied by means of conductive rod 109, fed by a bias voltage applied through an inductive choke 108. The voltage applied by electrode 102 is ordinarily sufficient to cause the self-oscillations in Gunn diode 100 to begin; a typical frequency of operation is 94 GHZ. Fine tuning may be accomplished by a metal tuner 103, which may be screw advanced deeper into the cavity or withdrawn, as desired. The changed position of 103 within the confines of the cavity 120 changes its Q, or quality factor, which directly affects the frequency of operation. The amount of voltage upon, and the size of electrode 102 will also affect the self-oscillating frequency of device 100. The electrode may be thought of as a coarse tuner, and 103 may be thought of as a fine tuner element.

Solid metal post 109 performs the function not only of conducting electricity down to elements 100 and 102, but also of physical anchoring support for the various elements, including elements 100 and 102. The post 115 and electrode 102 are typically round, cross-sectionally, though they need not be so. Atop post 115 is a Tee connection, at which place the bias line from inductor 108 may be connected such as at point 117, and from which an output line towards element 107 may be connected, as at point 118, e.g. Post 115 is electrically insulated from metal top wall 106, by insulator 111, which like 112, is a non-conductive insert, such as a standard O.S.M. fitting.

Surrounding Gunn diode 100, is a donut shaped ring 101, made of a material which is high resistivity, of the order of about 10,000 ohm-cm, e.g., and which could be silicon material for instance; the purpose of element 101 is to define a cavity geometry for matching the Gunn diode or negative resistance device to aid in detecting radiation as will be explained. Not only millimeter wave but also infrared wave radiation can pass through the window 105 if it is of the proper material. In the case of millimeter waves, detection can be accomplished as follows. The millimeter waves essentially pass completely through the silicon ring unaffected. When the waves impact upon the Gunn diode, a mixing operation takes place between the self-oscillation frequency and the operational frequency of the millimeter waves which typically are different in value. If millimeter waves enter through the window at a frequency of perhaps 95 GHZ, these signals will combine in the Gunn diode with the ongoing self oscillating frequency which might be 94 GHZ for example. The different signals will mix, yielding among other signals, an intermediate frequency signal. This IF signal, among others, will pass long post 115 eventually passing to output point 116 for display. From post connection 118 the IF signal may pass through element 107, a device for amplifying the signal if necessary, so that it might be displayed. Amplifier 107 may also possess band pass filter properties so that only the IF signal will be amplified and pass through out to 116.

In the case of infrared wave detection, the following can occur. When infrared wave radiation penetrates the silicon ring 101, holes and electrons may form in the silicon which would increase the material's conductivity. This change in the ring's electrical conductivity actually affects the whole cavity. The Q (quality factor) of the whole cavity is lowered, and this lowers the power level of energy waves oscillating within the cavity. A lowering of power levels therefore is an indication that infrared radiation has been encountered; monitoring of the cavity power levels is thus a part of the procedure for finding infrared radiation presence. One way of doing this as shown here, is to have a metal RF probe 104 remain inserted within the cavity to pick up presense of electrical power, the probe being electrically insulated from metal plate 106 by insert 112. Copper is a suitable material for the probe 104, as for the metal sides; however one could use any suitable non-magnetic conductive metal material. A wire 121 leads from probe 104 to power meter 110 used as a video detector. Any suitable device may be substituted for 110 however, such that the device can indicate the power levels coming out of probe 104, believed to be between 1-10 milliwatts exemplary. A suitable substitute is a reverse diode as video detector. While an exemplary 5 milliwatts of power might have existed in the cavity while self-oscillating, this level could drop to some 3-4 milliwatts upon arrival of infrared waves. Relatively sizable changes should therefore be a clear indication of the presence of infrared radiation.

Shown therefore is a means of detecting the presence of both infrared or millimeter wave radiation in a single device. While this invention may have been described with respect to a particular embodiment or embodiments, the description also includes all substitutions and modifications within the spirit and scope of the invention, as will be understood by those skilled in this art.

What is claimed is:

1. An infrared and millimeter wave radiation detection device comprising:
    a biased negative resistance device, self-oscillating within a microwave cavity; one end of said cavity adjacent the device comprising an optical window;
    means surrounding said negative resistance device, said means for surrounding being of a semiconductor material;
    means for probing the level of power subsistent within said cavity and means for establishing that said power level has experienced a drop;
    means connected to said negative resistance device for outputting the signals being generated by said negative resistance device; and means for detecting output signals of said device whose frequency is intermediate between that of a measured wave, and that of the self-oscillating frequency of the said negative resistance device;
    whereby a drop in power represents detection of infrared wave radiation and presence of an intermediate frequency signal represents detection of millimeter wave radiation.

2. The device of claim 1 wherein the said negative resistance device comprises a Gunn diode.

3. The device of claim 2 wherein the said means surrounding comprises a hollow ring of silicon material belted about the Gunn diode in the azimuth plane.

4. The device of claim 3 wherein the said optical window comprises a material transparent to infrared and millimeter waves.

5. The device of claim 4 wherein the said optical window comprises optical glass.

6. The device of claim 4 wherein the said optical window comprises high resistance semiconductor material.

7. The device of claim 6 wherein the said optical window comprises Gallium Arsenide material.

8. A single device for infrared and millimeter wave radiation detection comprising:
    a biased self-oscillating Gunn diode device including means for coarse and fine tuning of its oscillating frequency;
    a silicon material ring surrounding said Gunn diode device;
    a cavity for enclosing the said Gunn diode comprising metal walls, with one end wall being an optical window of Gallium Arsenide semiconductor material;
    an RF probe leading into said cavity as a pickup for measuring drop in the power of oscillation in the cavity as an indication of infrared wave radiation penetration;
    means for detecting an additional oscillating frequency, being an intermediate frequency of the Gunn diode, as an indication of millimeter wave radiation penetration.

9. The device of claim 8 comprising an IF amplifier within the intermediate frequency detecting means to aid in displaying the successful detection of the said millimeter waves, and further comprising a power meter means coupled to said RF probe for aid in detecting said drop in the power level.

* * * * *